(12) United States Patent
Beer et al.

(10) Patent No.: US 8,658,468 B2
(45) Date of Patent: Feb. 25, 2014

(54) METHOD FOR FABRICATING A SEMICONDUCTOR AND SEMICONDUCTOR PACKAGE

(75) Inventors: Gottfried Beer, Nittendorf (DE); Irmgard Escher-Poeppel, Regensburg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/570,986

(22) Filed: Aug. 9, 2012

(65) Prior Publication Data

US 2012/0319298 A1 Dec. 20, 2012

Related U.S. Application Data

(60) Division of application No. 13/529,315, filed on Jun. 21, 2012, now Pat. No. 8,492,200, which is a division of application No. 12/947,031, filed on Nov. 16, 2010, now Pat. No. 8,216,881, which is a continuation of application No. 11/837,211, filed on Aug. 10, 2007, now Pat. No. 8,258,624.

(51) Int. Cl.
*H01L 21/00* (2006.01)

(52) U.S. Cl.
USPC .... 438/110; 438/723; 438/778; 257/E21.502; 257/106; 257/112

(58) Field of Classification Search
USPC ......... 438/106–108, 110, 112–114, 124, 613, 438/622; 257/E21.145, E21.502, E21.508, 257/E21.509, E21.499, 693, 698, 723, 774, 257/778, 790
See application file for complete search history.

(56) References Cited

U.S. PATENT DOCUMENTS

| | | | |
|---|---|---|---|
| 5,353,498 A | 10/1994 | Fillion et al. | |
| 5,870,289 A | 2/1999 | Tokuda et al. | |
| 6,506,664 B1 | 1/2003 | Beyne et al. | |
| 6,746,898 B2 | 6/2004 | Lin et al. | |
| 6,780,493 B2 | 8/2004 | Noda et al. | |
| 6,919,508 B2 * | 7/2005 | Forcier | 174/565 |
| 6,972,964 B2 | 12/2005 | Ho et al. | |

(Continued)

FOREIGN PATENT DOCUMENTS

| | | |
|---|---|---|
| DE | 10132092 | 1/2003 |
| DE | 102004049663 | 4/2006 |

(Continued)

OTHER PUBLICATIONS

"An Embedded Device Technology Based on a Molded Reconfigured Wafer", M. Brunnbauer, et al., 2006 Electronic Components and Technology Conference, IEEE 2006.

(Continued)

*Primary Examiner* — Chris Chu
(74) *Attorney, Agent, or Firm* — Dicke, Billig & Czaja, PLLC

(57) ABSTRACT

A method for fabricating a semiconductor chip module and a semiconductor chip package is disclosed. One embodiment provides a first layer, a second layer, and a base layer. The first layer is disposed on the base layer, and the second layer is disposed on the first layer. A plurality of semiconductor chips is applied above the second layer, and the second layer with the applied semiconductor chips is separated from the first layer.

6 Claims, 11 Drawing Sheets

(56) References Cited

U.S. PATENT DOCUMENTS

| | | |
|---|---|---|
| 7,060,421 B2 | 6/2006 | Naundorf et al. |
| 7,163,843 B2 * | 1/2007 | Kiendl et al. ............ 438/114 |
| 7,170,162 B2 | 1/2007 | Chang |
| 7,202,107 B2 | 4/2007 | Fuergut et al. |
| 7,397,000 B2 | 7/2008 | Shimoto et al. |
| 7,438,636 B2 * | 10/2008 | Kulp et al. ............ 451/539 |
| 7,449,363 B2 | 11/2008 | Hsu |
| 7,554,196 B2 | 6/2009 | Bachmaier et al. |
| 7,554,197 B2 * | 6/2009 | Huang et al. ............ 257/737 |
| 7,619,304 B2 | 11/2009 | Bauer et al. |
| 7,625,781 B2 | 12/2009 | Beer |
| 7,656,018 B2 | 2/2010 | Bauer et al. |
| 7,662,667 B2 * | 2/2010 | Shen ............ 438/112 |
| 7,906,860 B2 * | 3/2011 | Meyer et al. ............ 257/790 |
| 7,927,922 B2 | 4/2011 | Shen et al. |
| 7,943,423 B2 * | 5/2011 | Pohl et al. ............ 438/112 |
| 8,039,315 B2 | 10/2011 | Lee et al. |
| 8,110,916 B2 | 2/2012 | Weng et al. |
| 8,193,647 B2 | 6/2012 | Hsieh et al. |
| 8,320,134 B2 | 11/2012 | Su et al. |
| 8,358,001 B2 | 1/2013 | Yang et al. |
| 8,372,689 B2 | 2/2013 | Lee et al. |
| 8,378,466 B2 | 2/2013 | Chiu et al. |
| 2003/0094695 A1 | 5/2003 | Hedler et al. |
| 2003/0134450 A1 * | 7/2003 | Lee ............ 438/106 |
| 2004/0232543 A1 | 11/2004 | Goller et al. |
| 2005/0136345 A1 | 6/2005 | Lazarev et al. |
| 2005/0260790 A1 * | 11/2005 | Goodner et al. ............ 438/106 |
| 2005/0287355 A1 * | 12/2005 | Matayabas, Jr. ............ 428/323 |
| 2006/0091522 A1 | 5/2006 | Bachmaier et al. |
| 2006/0231202 A1 | 10/2006 | Sakata et al. |
| 2009/0020864 A1 | 1/2009 | Pu et al. |
| 2010/0213581 A1 * | 8/2010 | Matayabas, Jr. ............ 257/632 |
| 2010/0224983 A1 | 9/2010 | Huang et al. |
| 2012/0015176 A1 * | 1/2012 | Riebel et al. ............ 428/323 |
| 2012/0291377 A1 * | 11/2012 | Riebel et al. ............ 52/232 |

FOREIGN PATENT DOCUMENTS

| | | |
|---|---|---|
| DE | 102005006995 | 8/2006 |
| DE | 102005025543 | 12/2006 |
| EP | 0611129 | 8/1994 |
| EP | 1491695 | 12/2004 |
| WO | 2004061953 | 7/2004 |
| WO | 2007019487 | 2/2007 |

OTHER PUBLICATIONS

Final Office Action related to U.S. Appl. No. 11/837,211 mailed Jul. 16, 2010.

Office Action related to U.S. Appl. No. 11/837,211 mailed Jan. 28, 2010.

Notice of Allowance related to U.S. Appl. No. 12/947,031 mailed Mar. 21, 2012.

* cited by examiner

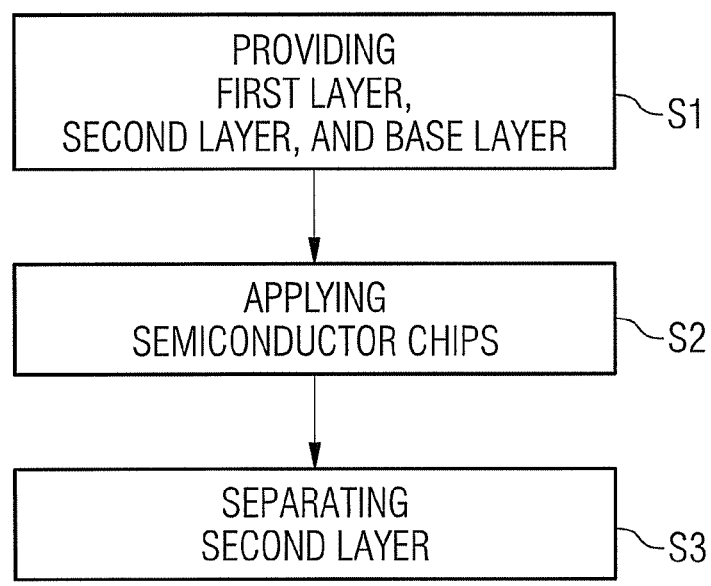

FIG 2A
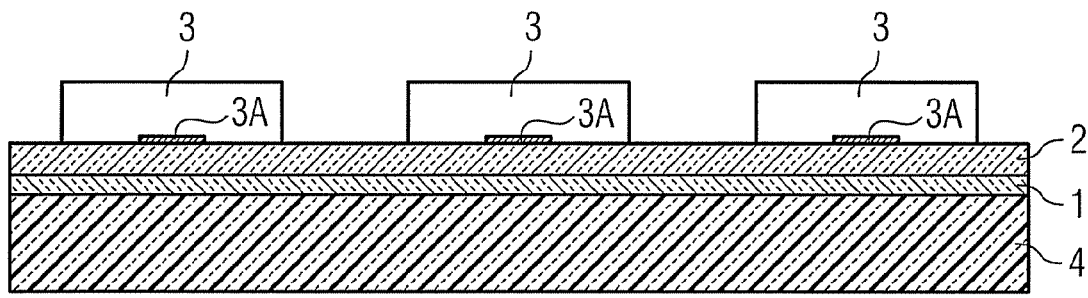
FIG 2B
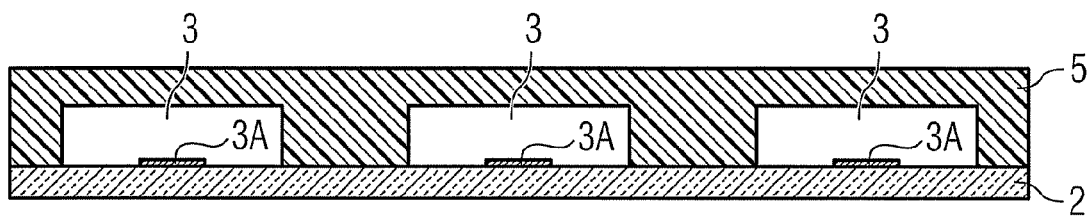

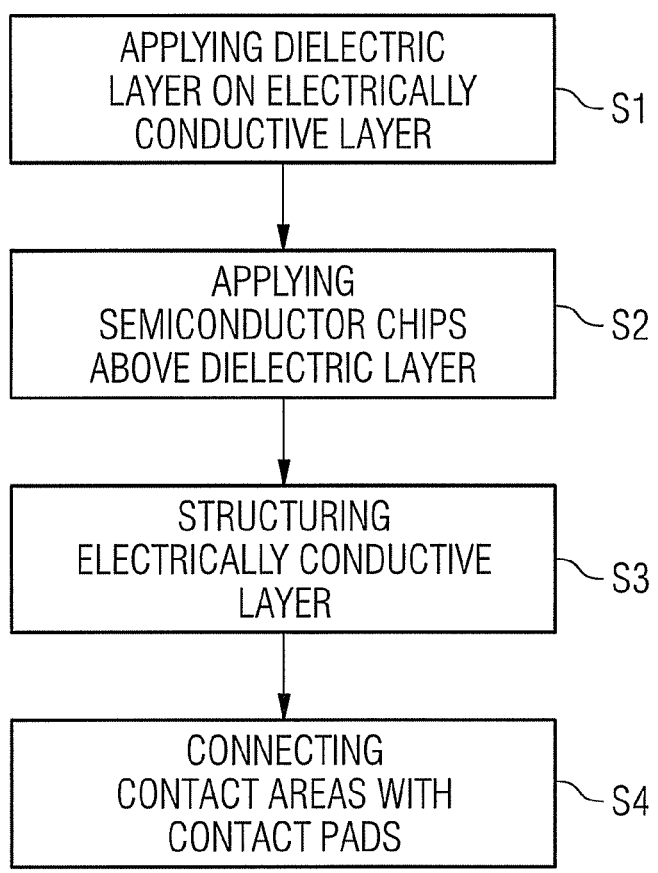

METHOD FOR FABRICATING A SEMICONDUCTOR AND SEMICONDUCTOR PACKAGE

CROSS-REFERENCE TO RELATED APPLICATIONS

This patent application is a Continuation application of Ser. No. 11/837,211, filed Aug. 10, 2007, now U.S. Pat. No. 8,258,624, which claims priority to Divisional application Ser. No. 13/529,315, filed Jun. 21, 2012, and Divisional application Ser. No. 12/947,301, filed Nov. 16, 2010, now U.S. Pat. No. 8,216,881, all of which are incorporated herein by reference.

BACKGROUND

The present invention relates to a method for fabricating a semiconductor chip module and a semiconductor chip package.

Semiconductor chips have contact pads on one or more of their surfaces. When housing the semiconductor chip in a chip package, the contact pads of the semiconductor chip have to be connected to external contact elements of the chip package.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a flow diagram of an embodiment of a method for fabricating a semiconductor chip module;

FIGS. 2A, B illustrate schematic cross-section representations of an intermediate product and the semiconductor chip module for illustrating a further embodiment as illustrated in FIG. 1;

FIG. 9 illustrates a flow diagram of an embodiment of a further method for fabricating a semiconductor chip module;

DETAILED DESCRIPTION

Figure 3A:
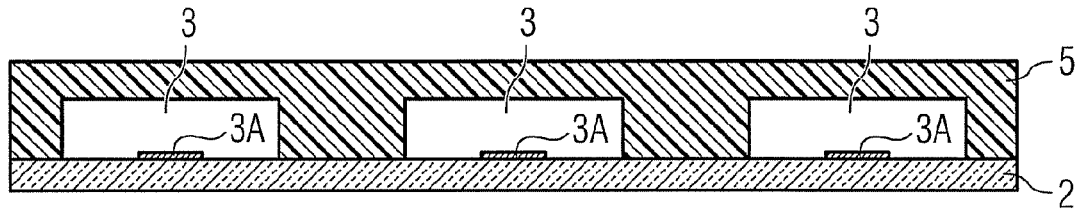
FIGS. 3A-D illustrate schematic cross-section representations of a semiconductor chip module for illustrating a further embodiment of the method as illustrated in FIGS. 2A, B.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The embodiments of a method for fabricating a semiconductor chip module and the embodiments of a semiconductor chip package may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives etc.

In several embodiments layers or layer stacks are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, like, for example, laminating techniques, as well as techniques in which layers are deposited in a sequential manner, like, for example, sputtering, plating, molding, CVD, etc.

The semiconductor chips may have contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, or an electrically conducting organic material, or an electrically conducting semiconductor material.

The semiconductor chips may be covered with a material layer. The material of the material layer can be any electrically insulating material like, for example, any kind of molding material, any kind of epoxy material, or any kind of resin material. In the process of covering the semiconductor chips with the material layer a fan-out embedded die can be fabricated. The fan-out embedded die can have the form of a wafer and will thus be called a "re-configured wafer" further below. However, it will be appreciated that the fan-out embedded die is not limited to the form and shape of a wafer but can have any size and shape and any suitable array of semiconductor chips embedded therein.

FIG. 1 illustrates a flow diagram of an embodiment of a method for fabricating a semiconductor chip module. The method includes providing a first layer, a second layer, and a base layer, wherein the first layer is disposed on the second layer, and the second layer is disposed on the base layer (s1), applying a plurality of semiconductor chips above the second layer (s2), and separating the second layer with the applied semiconductor chips from the first layer (s3).

The method as illustrated in the flow diagram of FIG. 1 is further illustrated in FIG. 2A, B. FIGS. 2A, B illustrate schematic cross-section representations of an intermediate product and a semiconductor chip module for illustrating a further embodiment of the method as illustrated in FIG. 1. Of FIG. 2A, there is illustrated an intermediate product after applying of a first layer 1 to a base layer 4 and applying a second layer 2 on the first layer 1 and applying a plurality of semiconductor chips 3 onto the second layer 2 and the semiconductor chips 3 can be encapsulated by a material layer 5 or cover layer 5 as will be outlined further below. Of FIG. 2B, the second layer 2 with the applied semiconductor chips 3 is separated from the first layer 1. The semiconductor chips 3 are illustrated each one having one contact pad 3A. It should be clear that the semiconductor chips 3 can have more than one contact pad.

The provision of the first layer 1, the second layer 2, and the base layer 4 as illustrated in FIG. 2A can be as follows. The first layer 2 and the second layer 2 are applied to one another, for example, by laminating first layer 1 to second layer 2, or vice versa. A commercially available pre-configured layer stack having the first layer 1 and the second layer 2 can be purchased. Then the layer stack having the first layer 1 and the second layer 2 is applied, in one embodiment laminated, to the base layer 4. Alternatively, the first layer 1 can be first applied, in one embodiment laminated, to the base layer 4 and afterwards the second layer 2 can be applied, in one embodiment laminated, to the first layer 1.

According to one embodiment as illustrated in FIGS. 2A, B, the first layer 1 is also separated from the base layer 4. In such a case the base layer 4 can be re-used. However, it is also possible that the first layer 1 remains on the base layer 4 so that in most cases the base layer 4 will not be in a condition to be re-used.

It is also illustrated in FIG. 2B that a material layer 5 is deposited onto the semiconductor chips 3 and the second layer 2. The material layer 5 can, for example, include a molding material wherein the molding technique can be, for example, compression molding. The potential molding materials include, for example, aliphatic and aromatic polymers including thermoplastic and thermoset type polymers and blends of these and also other various type of polymers. Furthermore, the second layer 2 may have a constitution so that it reacts with the mold compound in order to provide for a strong mechanical connection between the material layer 5 and the second layer 2. Moreover, the second layer 2 may be constituted such that it reacts with the surfaces of the semiconductor chips 3 during the molding and/or during the hardening of the mold compound in order to provide for a best reliable adhesion between the semiconductor chips 3 and the second layer 2.

Typical values for the thicknesses of the layers may be as follows. The thickness of the first layer 1 and the second layer 2 is typically ranges from 5 µm to 150 µm, whereas the thickness of the semiconductor chips typically ranges from 150 µm to 450 µm, and the thickness of the mold material layer typically ranges from 300 µm to 700 µm.

The base layer 4 may include, for example, any structural material, such as, for example, plastic, ceramic, or metal. However, further below there will be illustrated and explained further methods for fabricating a semiconductor chip module, which do not require the base layer 4.

The second layer 2 can be utilized, as will be illustrated further below, as an interconnect layer in a fan-out embedded die as will be further described below. That means, the second layer 2 carries the semiconductor chips 3 during the production of the re-configured wafer and also functions as the interconnect layer in the fan-out wafer-level package to be produced. For this purpose the second layer 2 needs to be made of a dielectric, insulating material which can be structured in order to access electrical conductors therein by means which will be outlined in further embodiments below. The two functions of the second layer 2 can, for example, be fulfilled with foils based on an acrylate or Epoxy-B-stage foils. The second layer 2, for example, can also be made from a prepreg (preimpregnated) foil, such as that known from substrate technology, e.g., a photostructurable prepreg which can be etched after lithographical exposure. Alternatively the second layer 2 could be ablated and structured with a laser beam. The second layer 2 can also include an additive, which releases electrically conducting material or releases a catalytic layer for plating upon irradiation. The second layer 2 should also have sufficient adhesion properties in order to fix the semiconductor chips 3 on its surface. If, however, the second layer 2 does not have itself sufficient adhesion force at its surface, a third layer (not illustrated) having an adhesion promoter can be applied to the surface of the second layer 2.

The first layer 1 may function as a release layer. In one embodiment, it may include a release system so that upon external predetermined conditions like, for example, heat or UV radiation, the first layer 1 can be released from the second layer 2 and also, if desired, from the base layer 4. Heat or UV radiation can be applied from below the base layer 4 so that in case of the first layer 1 being a thermal release tape the base layer 4 needs not to be optically transparent whereas in case of the first layer 1 being an UV light release tape, base layer 4 must be optically transparent for UV radiation. It is also possible that the first layer 1 has a release system only on the side towards the base layer 4 and the separation from the second layer 2 is accomplished as known from conventional adhesive film technology.

In a further embodiment of the method as illustrated in FIGS. 3A-D, an embodiment of a complete wafer-level packaging process will be described. This embodiment not only illustrates the fabrication of the semiconductor chip module but also the fabrication of single semiconductor chip packages out of the semiconductor chip module.

First of all, a semiconductor module is fabricated in principle of the embodiment as described in connection with FIGS. 1 and 2A, B. More specifically, the semiconductor chips 3 are placed onto the second layer 2 with a sufficient spacing in order to allow fan-out of the electrical contacts as will be seen later. A pick-and-place machine can be used for placing the semiconductor chips 3 on the second layer 2.

In the following, a re-configured wafer is produced during the molding process, i.e. during the fabrication of the molding material layer 5 as was illustrated in FIG. 2B. For example, a mold form can be used which has the form of a wafer so that by this kind of wafer molding, for example, a 200 mm re-configured wafer is produced. Thus the semiconductor module is comprised of a re-configured wafer and FIG. 3A illustrates a section of this re-configured wafer in a schematic cross-section. In addition there are illustrated contact pads 3A of the semiconductor chips 3.

Figure 3B:
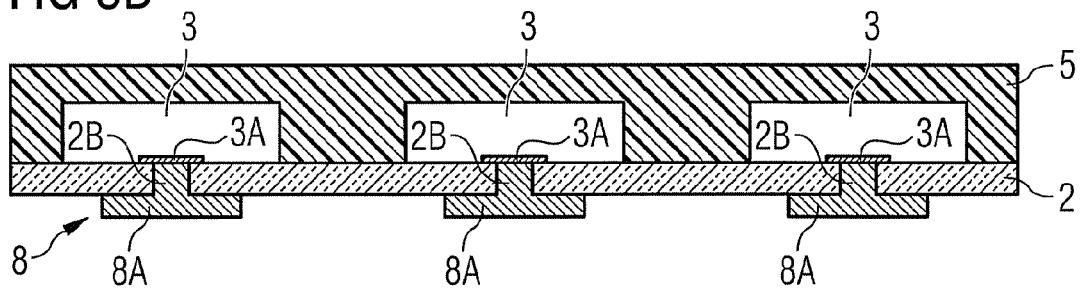

FIG. 3B illustrates a schematic cross-section of a section of the re-configured wafer of FIG. 3A after forming electrical conductors 2B into the second layer 2. The electrical conductors 2B extend through the second layer 2 and are connected with the contact pads 3A of the semiconductor chips 3. There will be described embodiments of forming the electrical conductors 2B further below. After forming of the electrical conductors 2B, a wiring layer 8 is formed on the surface of the second layer 2. The wiring layer 8 includes electrically conductive contact areas 8A connected to the electrical conductors 2B of the second layer 2. The wiring layer 8 fulfils the function of a re-distribution layer as it re-distributes the arrangement of the electrical contacts to allow a spacial fan-out of the electrical contacts.

Figure 3C:
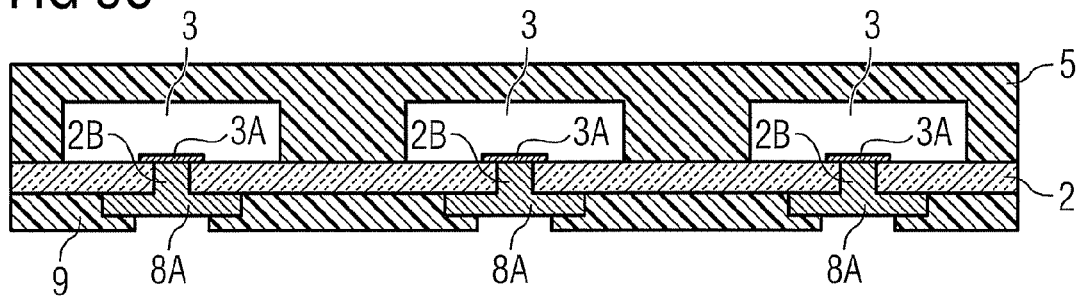

FIG. 3C illustrates a schematic cross-section of the section of the re-configured wafer of FIG. 3B after applying a structured solder resist layer 9 onto the electrically conductive contact areas 8A of the wiring layer 8 and in the gaps between the contact areas 8A. The solder resist layer 9 is structured so that the contact areas 8A are essentially not covered by the solder resist layer 9. Only for simplifying the picture the area 8A is illustrated directly over the electrical conductor 2B.

Figure 3D:
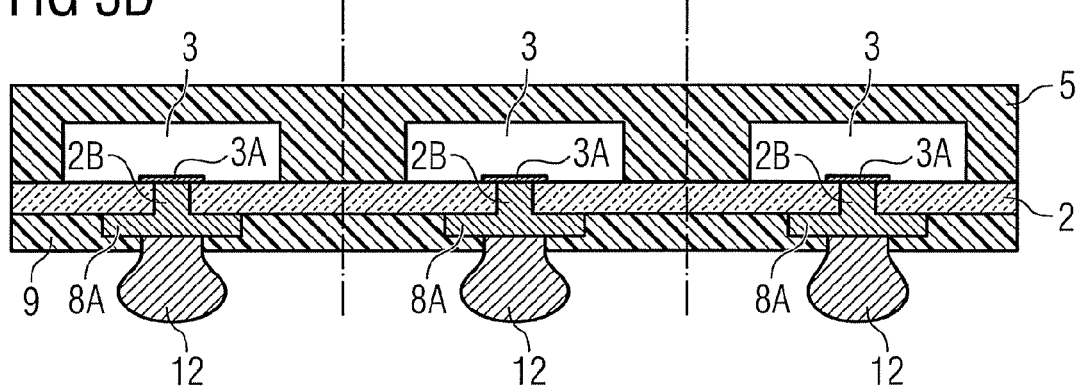

FIG. 3D illustrates a schematic cross-section of the section of the re-configured wafer of FIG. 3B after applying outer electrical contacts in the form of solder balls 12. When producing the solder balls 12, the solder material flows into the gaps between the contact areas 8A so that the solder balls 12 are electrically connected to the contact areas 8A of the wiring layer 8. In this case the contact areas 8A can be regarded as solder mask defined pads 8A. Next, the re-configured wafer can be separated into single semiconductor packages by e.g., dicing the re-configured wafer at the dashed lines.

Figure 4:
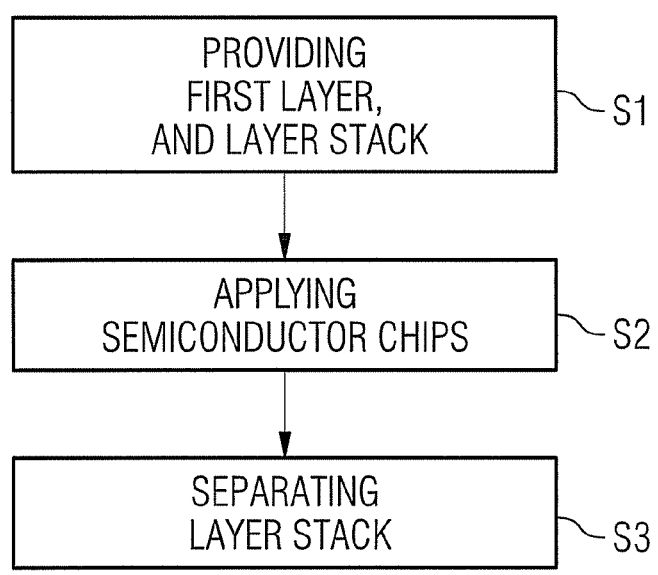
FIG. 4 illustrates a flow diagram of an embodiment of a further method for fabricating a semiconductor chip module.

FIG. 4 illustrates a flow diagram of an embodiment of a further method for fabricating a semiconductor chip module. The method includes providing a first layer and a layer stack disposed on the first layer, the layer stack having a seed layer and a second layer (s1), applying a plurality of semiconductor chips above the second layer (s2), and separating the layer stack with the applied semiconductor chips from the first layer (s3).

Figure 5A:
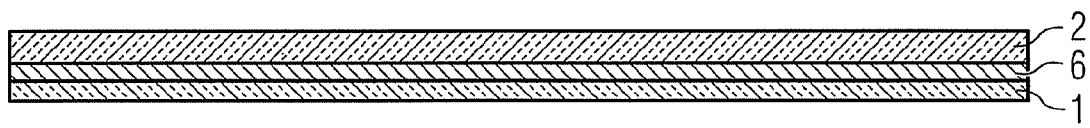
FIGS. 5A-C illustrate cross-section representations of intermediate products and the semiconductor chip module for illustrating a further embodiment of the method as illustrated in FIG. 4.
Figure 5B:
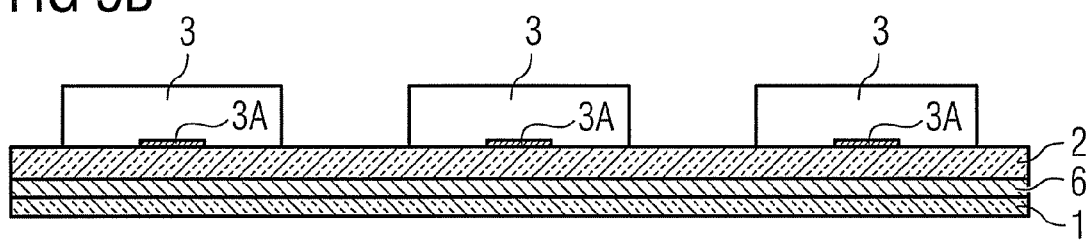
Figure 5C:
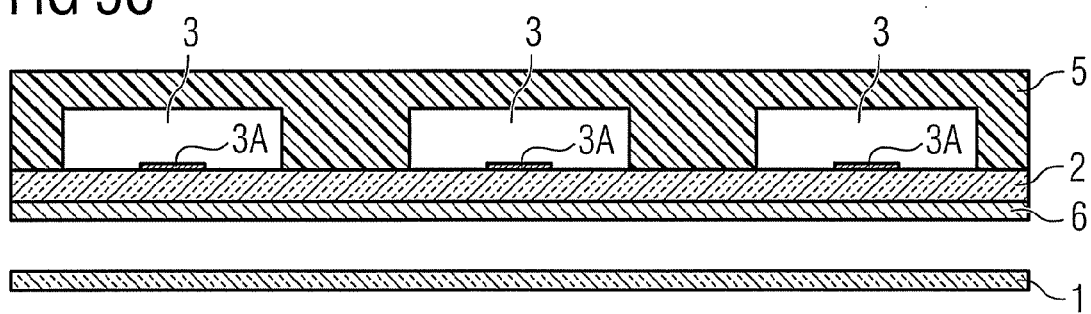

FIGS. 5A-C illustrate cross-section representations of intermediate products and a semiconductor chip module for illustrating a further embodiment of the embodiment of a method as illustrated in FIG. 4. FIG. 5A illustrates a layer stack having a seed layer 6 and a second layer 2, the layer stack being applied to one of the surfaces of the first layer 1. Of FIG. 5B, a plurality of semiconductor chips 3 is applied above the second layer 2 and afterwards a material layer 5, in one embodiment a mold layer, can be deposited onto the semiconductor chips 3 and the second layer 2 and then the layer stack with the applied semiconductor chips 3 is separated from the first layer 1. The resulting semiconductor chip module and the first layer 1 are illustrated in a cross-section, respectively, in FIG. 5C.

The material layer 5 can have the same properties as described above in connection with FIG. 2B.

In a further embodiment of the method as illustrated in FIGS. 4 and 5, the first layer 1 and the layer stack can be applied to a base layer, the plurality of semiconductor chips is applied above the second layer, and the layer stack with the applied semiconductor chips is separated from the first layer. If, however, the first layer 1 is itself a stable, rigid and handable sheet, then an extra base layer will not be needed. This embodiment is thus analogous to the embodiment as illustrated in FIGS. 2A, B, in which the base layer is designated with reference sign 4.

All further embodiments which were described in connection with FIGS. 1 and 2, in one embodiment as regards the first layer 1 and the second layer 2 can also be applied to the embodiment of FIGS. 4 and 5.

The seed layer 6 is utilized to assist a metallization plating process, e.g., a galvanic metallization process, which is performed in a later process for the fabrication of a wiring layer. The seed layer can be, for example, deposited onto the second layer 2 and afterwards the first layer 1 can, for example, be laminated onto the seed layer 6. In this case, the seed layer 6 can be deposited as a very thin metal layer. For example, the seed layer 6 can be deposited as a layer stack having a 50 nm Ti layer and a 200 nm Cu layer. In a further embodiment which will be described further below, the seed layer will not be deposited but will be generated on the surface of the second layer 2 by utilizing a specific material for the second layer, wherein the material of the second layer contains an additive, which releases electrically conducting material or releases a catalytic starter for plating upon irradiation. Also as described further below such seed layer will be structured by laser irradiation e.g., by a scanned laser beam or by an optical imaging system (mask, lens).

In the next process following FIG. 5C, the wiring layer and electrical conductors through the second layer 2 will have to be formed analogous to FIG. 3B. The wiring layer will be formed by using a photoresist and lithography and a plating process. For this purpose a photoresist layer will be deposited onto the seed layer 6 and the photoresist layer will be structured to define areas in which contact areas of the wiring layer are to be formed.

As an alternative to the embodiment as illustrated in FIGS. 5A-C, the photoresist layer can also be a part of the layer stack as fabricated in the beginning. In this case it is not necessary to deposit the photoresist layer in the stage as illustrated in FIG. 5C. This embodiment will be described in the following.

Figure 6A:
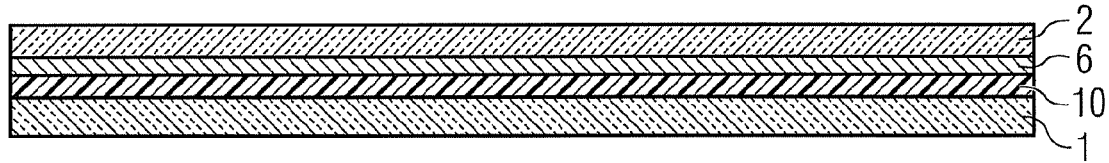
FIGS. 6A-D illustrate cross-section representations of the semiconductor chip module for illustrating a further embodiment of the method as illustrated in FIGS. 4 and 5.
Figure 6B:
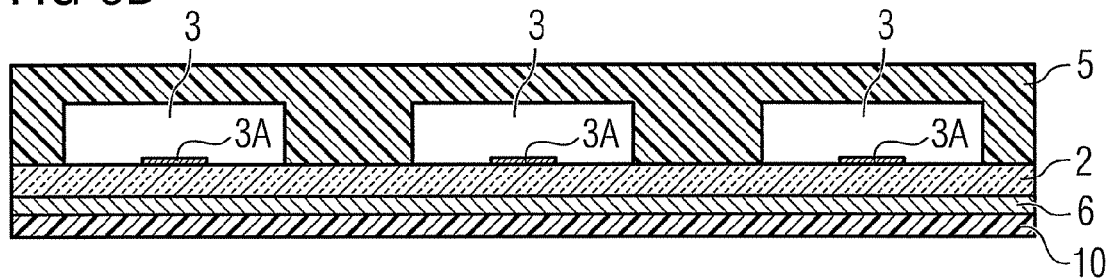

In FIGS. 6A-D there are illustrated schematic cross-section representations of intermediate products and a semiconductor chip module of a further embodiment of a method for fabricating a semiconductor chip module. In FIG. 6A there is illustrated a layer stack consisting of a second layer 2, a seed layer 6, and a photoresist layer 10. A first layer 1 is laminated onto the photoresist layer 10. FIG. 6B illustrates an intermediate product obtained after application of the semiconductor chips 3 and overmolding the chips 3 and the second layer 2 with the material layer 5 and separating the first layer 1. As explained in connection with previous embodiments, an additional base layer can be used to support the layer structure as illustrated in FIG. 6A, if necessary.

Figure 6C:
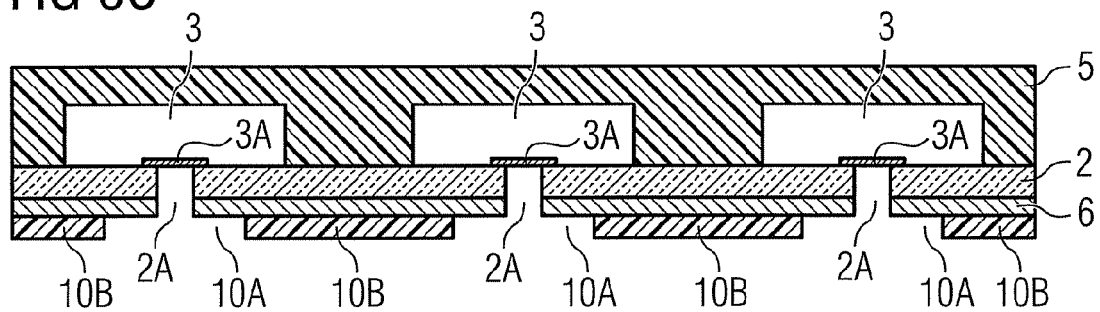

FIG. 6C illustrates an intermediate product obtained after exposing and developing the photoresist layer 10 by conventional resist and photolithography technology to define opening areas 10A which should become contact areas of a wiring layer to be produced and mask areas 10B. Also illustrated are vias 2A formed into the second layer 2, the vias 2A being in spatial connection with the areas 10A. The vias 2A can, for example, be produced by ablating the material of the second layer 2 with a laser beam after structuring of the photoresist layer 10. However, the vias 2A can, for example, also be produced by using the photoresist layer 10 wherein in a first lithography process the areas are defined where the vias 2A are to be produced and in a subsequent etching process the second layer 2 is etched through the openings of the photoresist layer to produce the vias 2A, and in a second lithography process a photoresist layer with openings 10A and mask areas 10B is produced as illustrated in FIG. 6C.

Figure 6D:
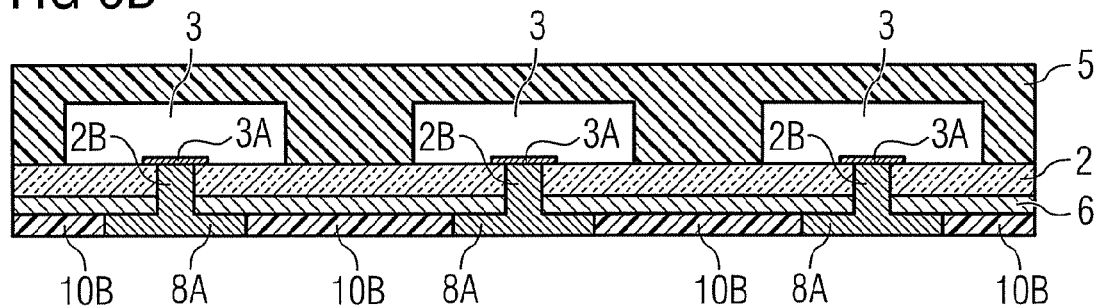

FIG. 6D illustrates an intermediate product obtained after filling the vias 2A with a solder material or with electrically conductive ink and a subsequent metallization by using, for example, copper, to generate the contact areas 8A of the wiring layer 8. The filling of the vias 2A with conductive ink might also be left out when it turns out that the vias 2A can be filled to a sufficient extent, in one embodiment without significant voids, with the galvanic metallization. In this case there will be only one metallization process for producing the contact areas 8A and the electrically conducting via connections between the contact areas 8A and the contact pads 3A on the semiconductor chips 3. FIG. 6D illustrates the semiconductor chip module having plated contact areas 8A and electrical conductors 2B formed in the vias 2A.

In the next process which is carried out after the intermediate product of FIG. 6D has been obtained, the mask areas 10B of the photoresist layer 10 will be removed so that in this plane only the wiring layer 8 with the contact areas 8A is left back. Afterwards the remaining areas of the seed layer 6 between the contact areas 8A will be removed by etching. Afterwards, as was already illustrated in FIGS. 3C and D, a solder resist layer will be deposited onto the wiring layer 8, the solder resist layer being structured such that it leaves the contact areas 8A essentially free, and afterwards solder balls are generated on top of the solder resist layer, each one of the solder balls being connected to one of the contact areas, respectively.

In a further embodiment of a method for fabricating a semiconductor chip module, the seed layer 6 of the embodiment as described in connection with FIGS. 6A-D will be omitted. That means, the layer stack of FIG. 6A consists of a second layer 2 and a photoresist layer 10. All features and processes of the embodiment of FIGS. 6A-D may be adopted besides the metallization process in FIG. 6C. As there is no seed layer, a galvanic metallization will not be possible. However, there will be other possibilities to fabricate the contact areas 8A. For example, the contact areas 8A might be produced by a screen printing process. Alternatively, after structuring of the photoresist layer 10 and optionally filling of the vias 2A a solder paste might be filled into the openings 10A of the structured photoresist layer 10.

Figure 7:
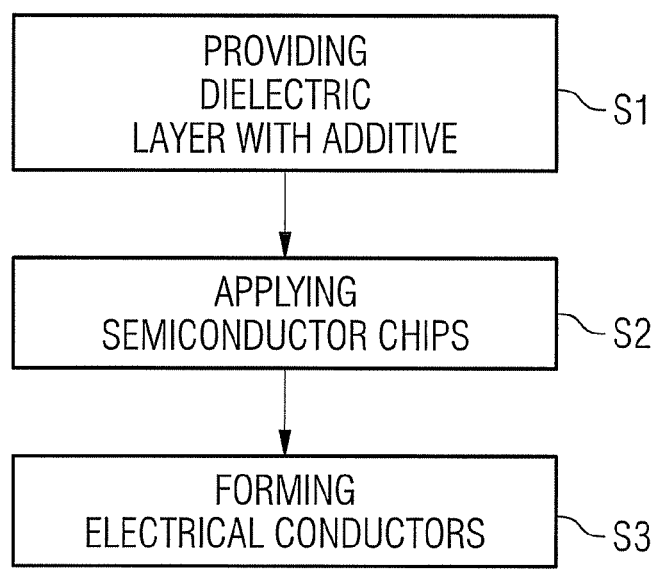
FIG. 7 illustrates a flow diagram of an embodiment of a further method for fabricating a semiconductor chip module.

Referring to FIG. 7, there is illustrated a flow diagram of an embodiment of a further method for fabricating a semiconductor chip module. The method includes providing a dielectric layer, the dielectric layer having an additive, which releases electrically conducting material or catalytic starter upon irradiation (s1), applying a plurality of semiconductor chips above the dielectric layer (s2), and forming a plurality of electrical conductors extending through the dielectric layer to connect to contact pads on surfaces of the semiconductor chips, respectively (s3).

The dielectric layer of this embodiment includes an additive, which releases a catalytic starter or an electrically conducting material upon irradiation with a beam of photons, ions and/or electrons. The additive may include, for example, metal complexes. These metal complexes are constituents of metalorganic compounds, which can be freed from their organic constituents by heat irradiation, laser exposure and/or heat treatment of their organic constituent and are then connected as metal complexes to form conduction paths or conduction areas. The additive may also include, for example, conducting nanoparticles which may be, for example, fullerenes. While fullerenes have a hollow spherical structure of hexagonally arranged carbon atoms, nanotubes form hollow tubes with hexagonally arranged carbon atoms on their circumference. These fullerenes or nanotubes may be exposed to form conduction paths by evaporating the surrounding plastic compound with the aid of laser processing.

Figure 8A:
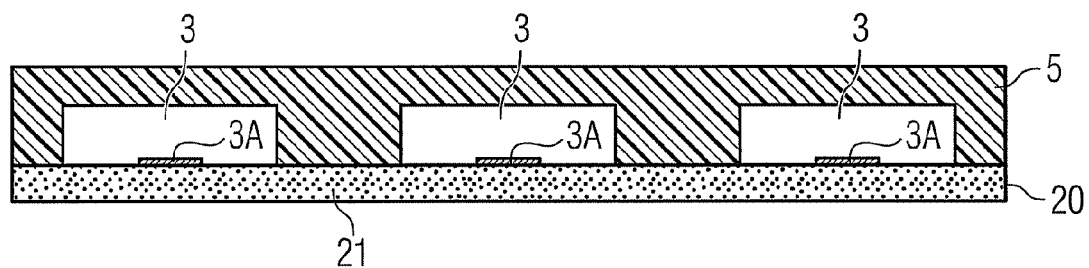
FIG. 8A-C illustrates cross-section representations of the semiconductor chip module for illustrating a further embodiment of a method as illustrated in FIG. 7.
Figure 8B:
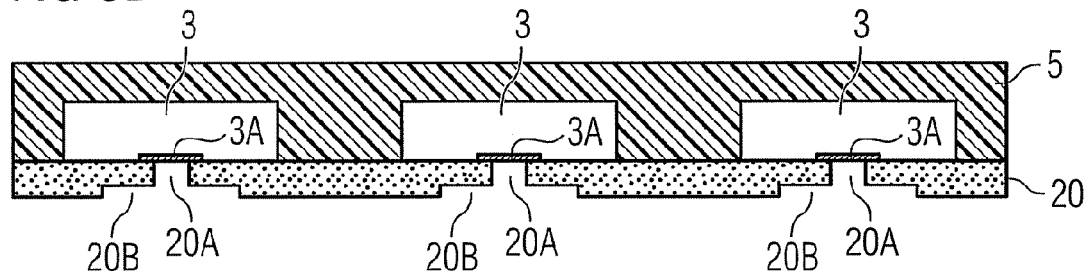
Figure 8C:
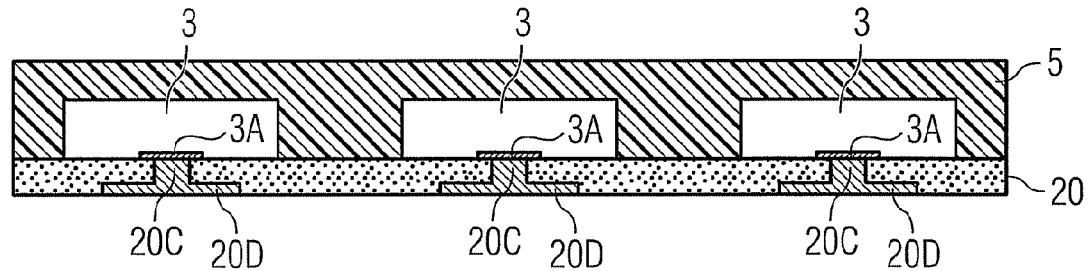

Referring to FIGS. 8A-C, there are illustrated cross-section representations of intermediate products and semiconductor chip modules fabricated for illustrating a further embodiment of the method as illustrated in FIG. 7. FIG. 8A illustrates a cross-section of an intermediate product having a dielectric layer 20. Of this embodiment the dielectric layer 20 includes an additive 21, which releases catalytic starters or an electrically conducting material upon irradiation with a beam of electromagnetic radiation, in one embodiment a laser beam. The material of the dielectric layer 20 can be removed or ablated by the laser beam and at the surfaces of the ablated regions the dielectric layer 20 is activated which means that at these surfaces the electrically conducting material is released so that conduction paths or conduction areas are formed. In case of a catalytic starter, metal layers are deposited at the irradiated areas by using chemical plating.

Of FIG. 8A, a plurality of semiconductor chips 3 is arranged on a surface of the dielectric layer 20, and a mold material layer 5 is deposited on and covering the semiconductor chips 3 and the dielectric layer 20. The chips 3 have at least one contact pad 3A, respectively. Applying a release layer 1 and a carrier layer 4 could be done as described previously.

In the following, the fabrication of a wiring layer will be described which functions as a redistribution layer. Of FIG. 8B, vias 20A are produced in the dielectric layer 20, the vias 20A extending from the surface of the dielectric layer 20 to the contacts pads 3A of the semiconductor chips 3, respectively. The vias 20A are produced by focusing the laser beam from the side of the dielectric layer 20 on locations of the dielectric layer 20 where the vias 20A are to be generated. At these locations the material of the dielectric layer 20 is removed or ablated so that the vias 20A are produced and at the same time of producing the vias 20A the irradiation of the laser beam activates the material of the dielectric layer 20 at the walls of the vias 20A, respectively. Therefore the wavelength and intensity of the laser beam has to be selected such that it removes or ablates the material of the dielectric layer 20 and also that it activates the material at the remaining surfaces of the dielectric layer at locations where material has been removed.

FIG. 8B also illustrates that areas 20B at the surface of the dielectric layer 20 adjacent to and surrounding the vias 20A are also treated with the laser beam. The areas 20B are intended to become the contact areas of the wiring layer. In the areas 20B a thin layer of the material of the dielectric layer 20 is removed or ablated by the laser beam so that flat trenches are produced at the areas 20B, respectively. At the bottom and side surfaces of the trenches the material of the dielectric layer 20 is activated as described above. The depth of the trenches could be also nearly zero.

FIG. 8C illustrates the semiconductor chip module after metallization of the vias 20A and the trenches in the areas 20B. The activated layers at the walls of the vias 20A and in the trenches of the areas 20B function as catalytic starter layers for subsequent metallization processes. In a first process, the vias 20A might be filled with electrically conductive ink which also might be unnecessary for the subsequent metallization process at least as an activation or preparation of the pad surface 3A is concerned. The penetration of the conductive ink into the vias 20A can be assisted by ultrasonic waves. After drying/sintering, electrical conductors 20C have been formed wherein the vias 20A are completely filled with the conductive ink or at least a layer having good electrical conductive properties remains on the surfaces of the vias 20A. Then in a second process, a plating process, in one embodiment a chemical metallization, is carried out to grow a metallic layer in the areas 20B and also in the vias 20A if the vias 20A have not been completely filled with the conductive ink. In principle it is also possible to omit the process of filling conductive ink into the vias 20A and instead to carry out the chemical metallization from the beginning. The metallization process can in principle also be carried out by a galvanic metallization, if all the traces could be connected to relevant current supply. With the metallization process, contact areas 20D are produced which form together the wiring layer functioning as a redistribution layer.

The metallic layer grown in the trenches of the areas 20B should have a sufficient thickness so that the individual layers may function as contact areas 20D of the redistribution layer. It may happen that the metallic layer is therefore grown higher than the depth of the trenches so that the metallic layer material extends over the edge portions of the trenches in a lateral direction. In order to prevent this scenario, an insulating layer could be deposited on the dielectric layer 20 before the metallization, wherein the insulating layer is deposited in regions outside the areas 20B. This will prevent that the plated metallic layer will extend in a lateral direction over the dielectric layer 20.

The semiconductor chip module as illustrated in FIG. 8C is now in a condition as that illustrated in FIG. 3C of the wafer-level packaging process. At next, analogous to FIG. 3D, the solder resist layer can be deposited and afterwards the solder balls can be applied. At the end, the module can be singulated to obtain a plurality of semiconductor chip packages.

The material of the dielectric layer 20 of the embodiment of FIGS. 7 and 8 is chosen and processed in a manner so that the activation of the material and the generation of conductive surface layers should function in the best possible way. As this is the main property of the dielectric layer to observed, it may be the case that the adhesive properties of the dielectric layer 2 are not as optimal as they should be in order to fix the semiconductor chips 3 at the surface. In this case an additional thin adhesive layer could be applied onto the surface of the dielectric layer 20 so that the semiconductor chips 3 could be applied to the adhesive layer. The adhesive layer could be made of or contain an adhesion promoter. The material could be chosen such that it can be ablated with the laser beam when forming the vias 20A. If the thickness of adhesive layer material between the semiconductor chip 3 and the dielectric layer 20 could be bridged over in the via 20C by the plating process, for example, the applied conductive ink as described earlier might ensure the electrical bridging for good conductivity.

FIG. 9 illustrates a flow diagram of an embodiment of a further method for fabricating a semiconductor chip module. The method includes applying a dielectric layer above an electrically conductive layer (s1), applying a plurality of semiconductor chips above the dielectric layer (s2), the semiconductor chips having a contact pad, respectively, structuring the electrically conductive layer so that it includes contact areas (s3), and connecting each one of the contact areas with one of the contact pads, respectively (s4).

Figure 10A:
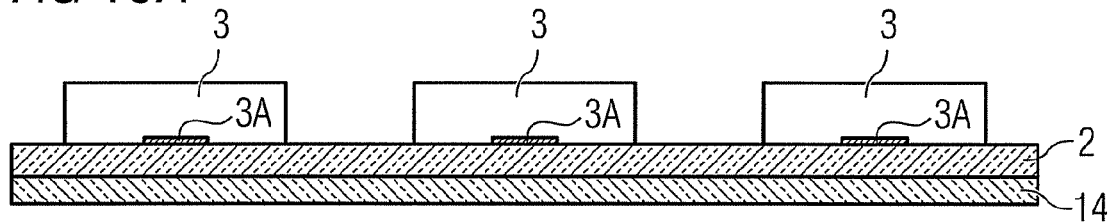
FIGS. 10A-D illustrate cross-section representations of an intermediate product and the semiconductor chip module for illustrating a further embodiment of the method as illustrated in FIG. 9.

Referring to FIGS. 10A-D, there are illustrated cross-section representations of intermediate product and a semiconductor chip module for illustrating an embodiment of the method as illustrated in FIG. 9. In FIG. 10A an intermediate product is illustrated which is obtained after applying a dielectric layer 2 to an electrically conductive layer 14 and applying a plurality of semiconductor chips 3 onto the dielectric layer 2. The chips 3 each have at least one contact pad 3A, respectively.

The electrically conductive layer 14 may include any electrically conductive material as, for example, a metal, a metal alloy, an organic electrically conductive material or an electrically conductive semiconductor. The electrically conductive layer 14 may include a homogeneous constitution of a particular electrically conductive material, for example, a metallic material. Alternatively the electrically conductive layer 14 can have a stacked configuration wherein two or more layers of different electrically conductive materials are stacked one above the other. For example, the electrically conductive layer 14 may include a metal layer stack, as for example an alternative sequence of layers of CuNiCu, CuTiCu, . . . or any other sequence of electrically conductive layers of different material. The thickness of the electrically conductive layer 14 can, for example, be in a range of from 10 µm to 1 mm. The conductive layer 14 can be, for example, a metallic sheet which is itself handable and can be used as a carrier in which case no extra carrier will be needed and no release process will be necessary. The conductive layer 14 can also be a thin layer so that a carrier is employed as was described in the embodiment illustrated in FIGS. 2A, B.

Figure 10B:
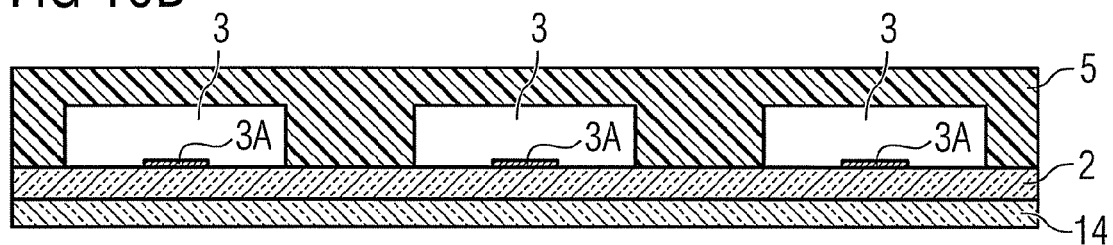

In FIG. 10B, the semiconductor chips 3 and the dielectric layer 2 are covered with a material layer 5. The material of the material layer 5 may include a molding material and the covering may include molding.

Figure 10C:
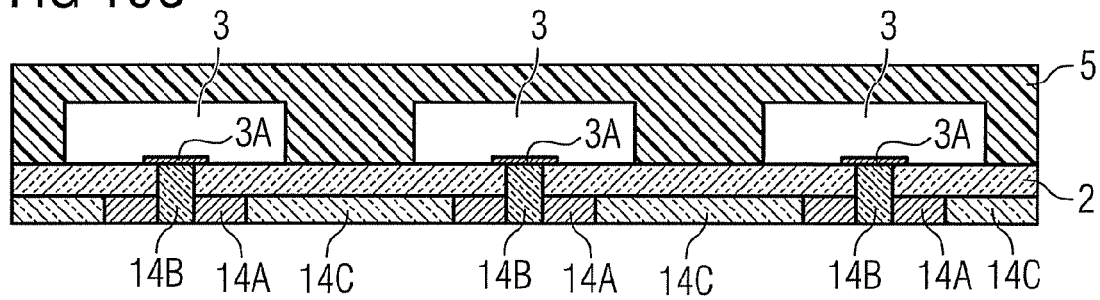

In FIG. 10C, the conductive layer 14 is structured into contact areas 14A and vias 14B are formed into the conductive layer 14 and the dielectric layer 2. The structuring can be done by a conventional photolithography and etching process. The structures to be removed are defined by the vias 14B and by predetermined regions 14C surrounding the contact areas 14A to be formed. In a first etching process the material of the conductive layer 14 is etched wherein the dielectric layer 2 can be used as an etch stop layer. In the first etching process a first mask is used which has openings corresponding to the predetermined regions 14C and the vias 14B. Then in a second etching process a second mask having openings corresponding to the vias 14B can be used. In the second etching process the material of the dielectric layer 2 is etched in order to extend the via 14B to the contact pad 3A of the semiconductor chip 3. Alternatively, instead of applying a second etching process for etching through the dielectric layer, also a laser structuring or laser ablation through the second mask having openings at the locations of the vias 14B, can be employed.

Figure 10D:
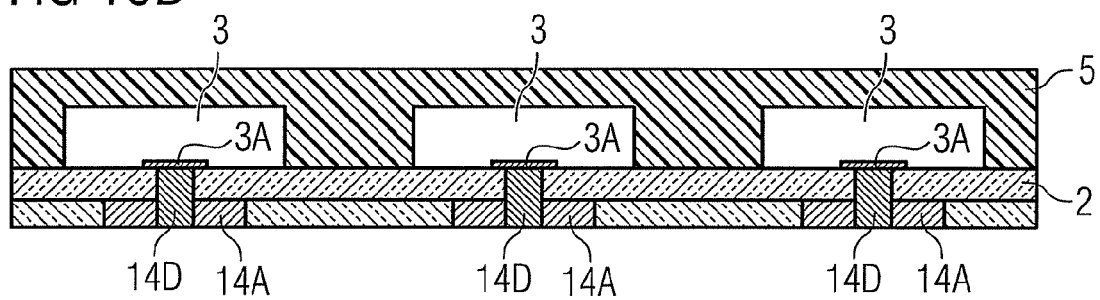

In FIG. 10D, the vias 14B are filled with an electrically conductive material like, for example, conductive ink or solder to become electrical conductors 14D. If necessary, the empty spaces 14C between the contact areas 14A can be filled with an insulating material.

The semiconductor chip module as illustrated in FIG. 10D is now in a condition as that illustrated in FIG. 3C of the wafer-level packaging process. At next, analogous to FIG. 3D, the solder resist layer can be deposited and afterwards the solder balls can be applied. At the end the module can be singulated to obtain a plurality of semiconductor chip packages.

Figure 11:
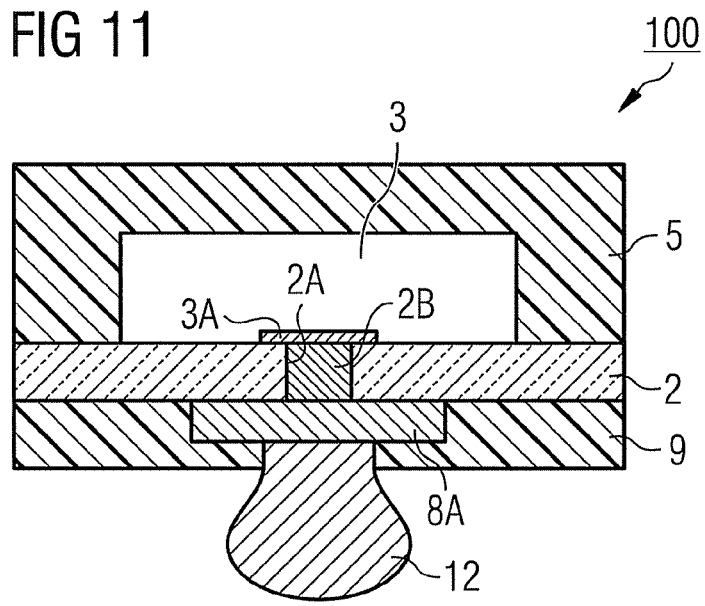
FIG. 11 illustrates a schematic cross-section representation of an embodiment of a semiconductor chip package.

Referring to FIG. 11, a schematic cross-section representation of an embodiment of a semiconductor chip package is illustrated. The semiconductor chip package 100 includes a semiconductor chip 3 having contact pads 3A on a first surface of the chip 3, a material layer 5 covering the semiconductor chip 3, except for a first surface of the chip 3, a dielectric layer 2 situated on the first surface of the chip 3, the dielectric layer 2 having a via 2A aligned with the contact pad 3A, wherein the via 2A is filled with conductive ink.

The via 2A filled with conductive ink forms an electrical conductor 2B. The electrical conductor 2B can be used to make electrical contact with a contact area 8A which is applied to a surface of the dielectric layer 2 lying opposite to the contact 3A of the chip 3. The conductor 2B therefore connects the contact pad 3A to the contact area 8A. The contact area 8A can be an electrically conductive layer, in one embodiment a metallic layer fabricated by a plating process, like galvanic plating or chemical plating. As indicated above, there can be more than one contact pad 3A on the surface of the semiconductor chip 3, wherein all contact pads are connected by electrical conductors like the electrical conductor 2B to contact areas like the contact area 8A, respectively. Furthermore, as illustrated in the embodiment of FIG. 11, a solder resist layer 9 can be applied onto the dielectric layer 2 and the contact area 8, wherein a main portion of the contact area 8A is not covered by the solder resist layer 9.

The dielectric layer 2 can include one or more of an acrylate material, an Epoxy-B-stage material or a material including an additive, which releases catalytic starter or electrically conducting material upon irradiation.

Figure 12:
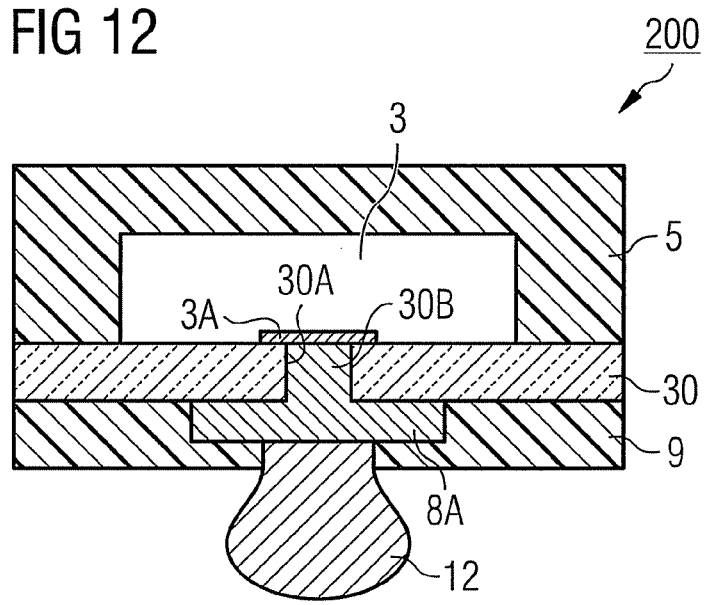
FIG. 12 illustrates a schematic cross-section representation of a further embodiment of the semiconductor chip package of FIG. 11.

Referring to FIG. 12, a schematic cross-section representation of a further embodiment of a semiconductor chip package is illustrated. The semiconductor chip package 200 includes a semiconductor chip 3 having a contact pad 3A on a first surface of the chip 3, a material layer 5 covering the semiconductor chip 3, except for a first surface of the chip 3, and a dielectric layer 30 situated above the first surface of the chip 3, wherein the dielectric layer 30 includes one or more of an acrylate material, an Epoxy-B-stage material, or a material including an additive or additives, which releases catalytic starter or electrically conducting material upon irradiation.

As further illustrated in FIG. 12, the dielectric layer 30 may include a via 30A aligned with the contact pad 3A, wherein the via 30A can be filled with conductive material, e.g., conductive ink. The via 30A filled with conductive ink forms an electrical conductor 30B. The electrical conductor 30B can be used to make electrical contact with a contact area 8A which is applied to a surface of the dielectric layer 30 lying opposite to the contact 3A of the chip 3. The conductor 30B therefore connects the contact pad 3A to the contact area 8A. The contact area 8A can be an electrically conductive layer, in one embodiment a metallic layer fabricated by a plating process, like galvanic plating or chemical plating. As indicated above, there can be more than one contact pad 3A on the surface of the semiconductor chip 3, wherein all contact pads are connected by electrical conductors like the electrical conductor 30B to contact areas like the contact area 8A, respectively. Furthermore, as illustrated in the embodiment of FIG. 12, a solder resist layer 9 can be applied onto the dielectric layer 30 and the contact area 8, wherein a main portion of the contact area 8A is not covered by the solder resist layer 9.

The semiconductor chip package 100 (FIG. 11) or 200 (FIG. 12) may have more than one redistribution layer. The semiconductor chip package 100 or 200 may include more than one chip and may include also passive components. The semiconductor chip package may have vias through the material layer (cover layer) 5 and the material layer 5 might have metal and/or dielectric structures at the opposite side of the first side of the chip 3. The semiconductor chip package might be not fully covered by the material layer 5 and might leave the backside of the chip 3 uncovered so that the backside of the chip 3 is exposed. The material layer 5 might be not parallel to the first side of the chip 3, it might be structured 3-dimensional.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip package, comprising:
   at least one semiconductor chip comprising a contact pads on a first surface of the semiconductor chip;
   a material layer covering at least partially the semiconductor chip, other than the first surface of the semiconductor chip; and
   a dielectric layer disposed above the first surface of the semiconductor chip, wherein the dielectric layer comprises a material with at least one additive, wherein the at least one additive releases a catalytic starter or an electrically conducting material upon irradiation.

2. The semiconductor chip package of claim 1, wherein the dielectric layer comprises a plurality of vias aligned with the plurality of contact pads, wherein the plurality of vias are filled with conductive material.

3. The method of claim 2, wherein the conductive material comprises conductive ink.

4. The semiconductor chip package of claim 1, further comprising:
   a wiring layer comprising a contact area connected with the plurality of vias.

5. The semiconductor chip package of claim 4, further comprising:
   a solder resist layer applied above the wiring layer, the solder resist layer comprising an opening in which the contact area is exposed.

6. The semiconductor chip package of claim 4, further comprising:
   a solder ball applied above the opening of the solder resist layer, the solder ball being electrically connected with the contact area.

\* \* \* \* \*